United States Patent
Wang et al.

(10) Patent No.: US 7,407,882 B1
(45) Date of Patent: Aug. 5, 2008

(54) SEMICONDUCTOR COMPONENT HAVING A CONTACT STRUCTURE AND METHOD OF MANUFACTURE

(75) Inventors: Connie Pin-Chin Wang, Menlo Park, CA (US); Paul R. Besser, Sunnyvale, CA (US); Wen Yu, Fremont, CA (US); Jinsong Yin, Sunnyvale, CA (US); Keizaburo Yoshie, Cupertino, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 135 days.

(21) Appl. No.: 10/928,665

(22) Filed: Aug. 27, 2004

(51) Int. Cl.
*H01L 21/4763* (2006.01)

(52) U.S. Cl. .................. 438/649; 438/655; 438/683
(58) Field of Classification Search ............. 438/649, 438/655, 683
See application file for complete search history.

(56) References Cited

U.S. PATENT DOCUMENTS

| | | | |
|---|---|---|---|
| 5,070,038 | A | 12/1991 | Jin |
| 5,464,520 | A * | 11/1995 | Kano et al. ............ 204/298.13 |
| 5,534,730 | A | 7/1996 | Mori et al. |
| 6,258,716 | B1 * | 7/2001 | Ku .............................. 438/654 |
| 6,278,150 | B1 | 8/2001 | Okudaira et al. |
| 6,461,960 | B2 * | 10/2002 | Lee ............................. 438/683 |
| 6,468,914 | B1 | 10/2002 | Jang et al. |
| 6,524,952 | B1 * | 2/2003 | Srinivas et al. ............. 438/649 |
| 6,696,109 | B2 | 2/2004 | Akram |
| 6,734,051 | B2 * | 5/2004 | Basceri et al. ............. 438/151 |
| 2001/0006240 | A1 * | 7/2001 | Doan et al. ................. 257/296 |
| 2002/0064949 | A1 | 5/2002 | Shah et al. |
| 2002/0102849 | A1 | 8/2002 | Yi et al. |
| 2002/0105043 | A1 | 8/2002 | Hu |
| 2002/0123190 | A1 * | 9/2002 | Nakamura et al. .......... 438/238 |
| 2002/0132475 | A1 * | 9/2002 | Sharan et al. ............... 438/656 |
| 2002/0168468 | A1 * | 11/2002 | Chou et al. ............. 427/255.27 |
| 2003/0072892 | A1 * | 4/2003 | Akram ....................... 427/569 |

OTHER PUBLICATIONS

S. Wolf and R.N. Tauber, Silicon Processing for the VLSI Era, vol. 1, second edition, Lattice Press, 2000, pp. 438-443.*

* cited by examiner

*Primary Examiner*—Tuan H Nguyen
(74) *Attorney, Agent, or Firm*—Farjami & Farjami LLP

(57) ABSTRACT

A semiconductor component having a titanium silicide contact structure and a method for manufacturing the semiconductor component. A layer of dielectric material is formed over a semiconductor substrate. An opening having sidewalls is formed in the dielectric layer and exposes a portion of the semiconductor substrate. Titanium silicide is disposed on the dielectric layer, sidewalls, and the exposed portion of the semiconductor substrate. The titanium silicide may be formed by disposing titanium on the dielectric layer, sidewalls, and exposed portion of the semiconductor substrate and reacting the titanium with silane. Alternatively, the titanium silicide may be sputter deposited. A layer of titanium nitride is formed on the titanium silicide. A layer of tungsten is formed on the titanium nitride. The tungsten, titanium nitride, and titanium silicide are polished to form the contact structures.

5 Claims, 1 Drawing Sheet

SEMICONDUCTOR COMPONENT HAVING A CONTACT STRUCTURE AND METHOD OF MANUFACTURE

FIELD OF THE INVENTION

The present invention relates, in general, to a contact structure suitable for use in a semiconductor component and, more particularly, to a contact structure comprising titanium silicide.

BACKGROUND OF THE INVENTION

Semiconductor component manufacturers are constantly striving to increase the speeds of their components. Because a semiconductor component, such as a microprocessor, can contain more than a billion transistors, the focus for increasing speed has been to decrease the gate delays of the semiconductor devices that make up the semiconductor component. As a result, the gate delays have been decreased to the point that speed is now primarily limited by the propagation delay of the metallization system used to interconnect the semiconductor devices with each other and with elements external to the semiconductor component. Typically, metallization systems comprise a plurality of interconnect layers vertically separated from each other by a dielectric material and electrically coupled to each other by metal-filled vias or conductive plugs. Each layer contains metal lines, metal-filled vias, or a combination of metal lines and metal-filled vias separated by an insulating material. To decrease the signal delay through these structures, manufacturers use highly conductive metals such as copper for the primary signal conductors.

In addition to the gate delays and the metallization system, the structure of the contacts affects the speed of the semiconductor component. Contacts are metallization structures that couple the silicon portions of the semiconductor device to the metallization system. Typically, a contact comprises a layer of metal silicide and a conductive material formed on the metal silicide layer. The metal silicide layer is formed by depositing a refractory metal such as titanium on the semiconductor substrate and heating the metal and semiconductor substrate to form the metal silicide. A drawback with this approach is that a high temperature anneal is needed to achieve sufficient titanium-silicon intermixing to form a metal-silicide layer having an acceptably low resistance. Another drawback is that formation of the silicide layer consumes silicon from the semiconductor substrate, which may increase the resistance of the semiconductor material near the contact structure.

Accordingly, what is needed is a contact structure for use in a semiconductor component and a method for manufacturing the contact structure.

SUMMARY OF THE INVENTION

The present invention satisfies the foregoing need by providing a semiconductor component and a method for manufacturing the semiconductor component having a contact structure comprising titanium silicide. In accordance with one aspect, the present invention includes providing a semiconductor substrate having a major surface. A dielectric material is formed over the semiconductor substrate and an opening having sidewalls is formed in the dielectric layer. The opening exposes a portion of the semiconductor substrate. A layer of titanium silicide is formed on the sidewalls, the dielectric layer, and the exposed portion of the semiconductor substrate. A layer of titanium nitride is formed on the layer of titanium silicide and tungsten is formed on the titanium nitride layer.

In accordance with another aspect, the present invention comprises a method for making a semiconductor contact suitable for use in a semiconductor component. A layer of dielectric material is formed over a semiconductor substrate. An opening having sidewalls is formed in the dielectric layer. The opening exposes a portion of the semiconductor substrate. A layer of titanium is formed on the sidewalls and the exposed portion of the semiconductor substrate. The titanium layer may be formed by sputter deposition in a plasma vapor deposition apparatus or it can be formed by reacting titanium tetrachloride with a free radical in a chemical vapor deposition apparatus. Silane is reacted with the layer of titanium to form a layer of titanium silicide.

In accordance with yet another aspect, the present invention includes a semiconductor component comprising a dielectric layer disposed on a semiconductor substrate. An opening having sidewalls extends from the major surface of the dielectric layer into the dielectric material and exposes a portion of the semiconductor substrate. A layer of titanium silicide lines the sidewalls and the exposed portion of the semiconductor substrate.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Figure 1:
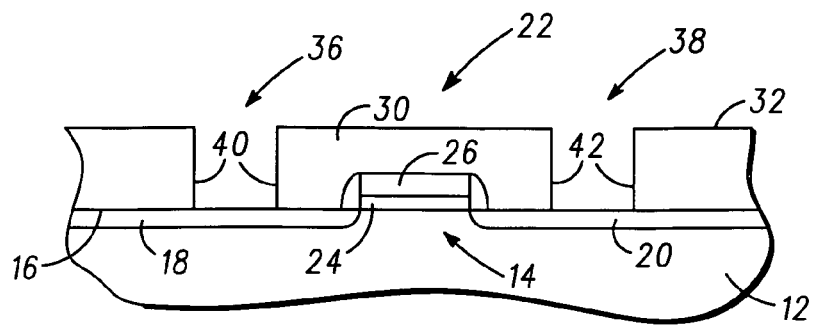
FIG. 1 is a cross-sectional side view of a semiconductor component at an intermediate stage of manufacture in accordance with an embodiment of the present invention.

FIG. 1 is an enlarged cross-sectional side view of a semiconductor component 10 during an intermediate stage of manufacture in accordance with an embodiment of the present invention. What is shown in FIG. 1 is a portion of a semiconductor substrate 12 in which a semiconductor device 14 has been fabricated. Semiconductor substrate 12 has a major surface 16. Semiconductor device 14 is an insulated gate field effect transistor having a source 18, a drain 20, and a gate structure 22. Gate structure 22 comprises a gate dielectric 24 and a gate electrode 26. Techniques for manufacturing insulated gate field effect transistor 14 are known to those skilled in the art. Although semiconductor device 14 has been described as an insulated gate field effect transistor, the type of semiconductor device is not a limitation of the present invention. Suitable semiconductor devices include active elements such as, for example, complementary insulated gate field effect transistors, junction field effect transistors, bipolar junction transistors, diodes, and the like, as well as passive elements such as, for example, capacitors, resistors, and inductors. Likewise, the material of semiconductor substrate 12 is not a limitation of the present invention. Substrate 12 can be silicon, Silicon-On-Insulator (SOI), Silicon-On-Sapphire (SOS), silicon germanium, germanium, an epitaxial layer of silicon formed on a silicon substrate, or the like. In addition, semiconductor substrate 12 may be a compound semiconductor material such as gallium-arsenide, indium-phosphide, or the like.

A layer of dielectric or insulating material 30 having a surface 32 and a thickness ranging from about 3,000 Å to about 10,000 Å is formed on semiconductor substrate 12. Suitable materials for dielectric layer 30 include those having a dielectric constant ($\kappa$) greater than 3.9 such as for example, silicon dioxide, silicon nitride, hydrogenated oxidized silicon carbon, and the like. Alternatively, dielectric layer 30 may be a material having a dielectric constant lower than 3.9 such as, for example, polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, and benzocyclobutene (BCB). Suitable inorganic low $\kappa$ dielectric materials include, but are not limited to, hydrogen silsesquioxane (HSQ), methyl silsesquioxane (MSQ), fluorinated glass, or NANOGLASS. The type of dielectric material for dielectric layer 30 is not a limitation of the present invention and other organic and inorganic dielectric materials may be used. Similarly, the method for forming dielectric layer 30 is not a limitation of the present invention and can include techniques such as spin-on coating, spray-on coating, Chemical Vapor Deposition (CVD), Plasma Enhanced Chemical Vapor Deposition (PECVD), Plasma Vapor Deposition (PVD), and the like.

Openings 36 and 38 having sidewalls 40 and 42, respectively, are formed in dielectric layer 30 and expose portions of semiconductor surface 16. By way of example, openings 36 and 38 are formed using photolithography and a reactive ion etch, which exposes portions of surface 16.

Figure 2:
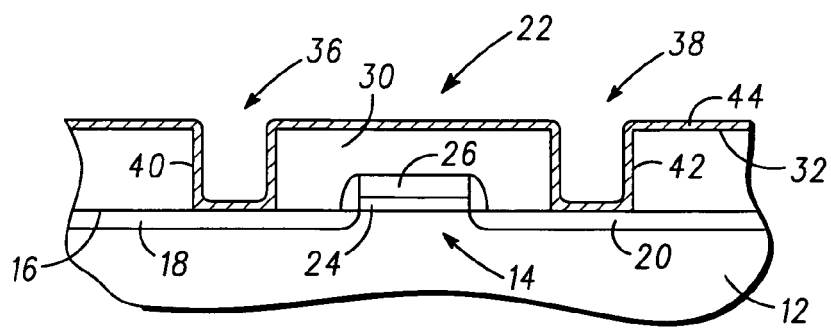
FIG. 2 is a cross-sectional side view of the semiconductor component of FIG. 1 at a later stage of manufacture.

Referring now to FIG. 2, a titanium layer 44 is formed on the exposed portions of semiconductor surface 16, sidewalls 40 and 42, and surface 32. In accordance with one embodiment, titanium layer 44 is formed using Plasma Vapor Deposition (PVD). Semiconductor component 10 is placed in a PVD reaction chamber in which a titanium target is mounted. The pressure within the PVD reaction chamber is adjusted to be between about 0.1 milliTorr (mTorr) and about 80 mTorr and the temperature is adjusted to be between about 25 degrees Celsius (° C.) and about 300° C. The exposed portions of semiconductor surface 16, sidewalls 40 and 42, and dielectric surface 32 are cleaned using a sputter clean or a reactive clean. When the clean is a sputter clean, it is preferably performed in an argon ambient. When the clean is a reactive clean, it is preferably performed in either an ammonia ($NH_3$) ambient or a hydrogen ($H_2$) ambient. Then, a layer of titanium having a thickness ranging from about 50 Å to about 300 Å is sputtered onto semiconductor surface 16, sidewalls 40 and 42, and dielectric surface 32. Typically, the PVD deposition is not conformal. Thus, the actual thickness of the titanium deposited on the exposed portions of surface 16, i.e., the bottoms of openings 36 and 38, ranges from about 20 Å to about 100 Å, depending on the aspect ratio of openings 36 and 38 and the nominal deposition thickness. The typical bottom coverage of a high aspect ratio contact ranges from about 20% to about 50%, where the percentage is the ratio of the titanium thickness at the contact bottom to the nominal deposition thickness. The argon is purged and optionally the pressure within the reaction chamber is adjusted to a base pressure of less than about $10^{-7}$ Torr.

Figure 3:
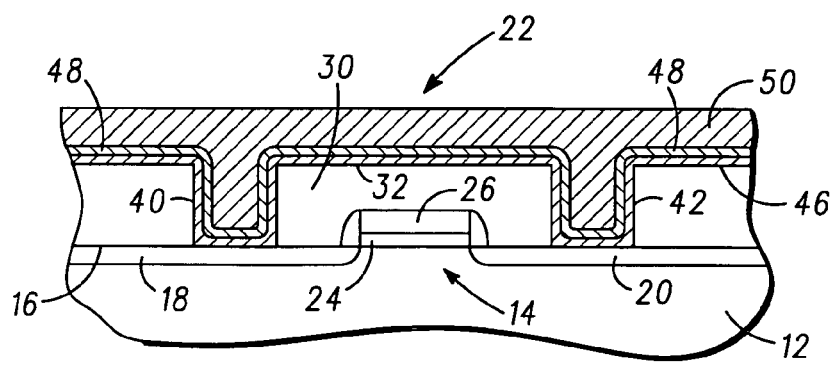
FIG. 3 is a cross-sectional side view of the semiconductor component of FIG. 2 at a later stage of manufacture.

Referring now to FIG. 3, silane is introduced into the reaction chamber at a flow rate ranging from about 5 standard cubic centimeters per minute (sccm) to about 100 sccm. The silane reacts with titanium layer 44 to form a titanium silicide layer 46 ($TiSi_x$, where x ranges from 0.1 to 0.7). The thickness of $TiSi_x$ layer 46 ranges from about 20 Å to about 200 Å. The excess silane and reaction byproducts such as for example, hydrogen and hydrogen radicals, are pumped out of the reaction chamber.

In accordance with another embodiment, titanium layer 44 is formed using Chemical Vapor Deposition (CVD). Semiconductor component 10 is placed in a CVD reaction chamber. The pressure within the CVD reaction chamber is adjusted to be between about 1 Torr and about 150 Torr. The temperature within the CVD reaction chamber is adjusted to be between about 400° C. and about 800° C. A precursor containing titanium such as, for example, titanium tetrachloride is introduced into the reaction chamber. In addition, free radicals are introduced into the CVD reaction chamber. Suitable free radicals include hydrogen free radicals and ammonia free radicals. The free radicals react with the titanium tetrachloride to form titanium layer 44 on the exposed portions of semiconductor surface 16, sidewalls 40 and 42, and dielectric surface 32. Silane is introduced into the reaction chamber at a flow rate ranging from about 5 sccm to about 100 sccm. The silane reacts with the titanium to form $TiSi_x$ layer 46, where x ranges from 0.1 to 0.7. The thickness of $TiSi_x$ layer 46 ranges from about 20 Å to about 200 Å. The excess silane and reaction byproducts are pumped out of the reaction chamber.

In accordance with another embodiment, titanium silicide layer 46 is formed using sputter deposition from a titanium silicide target.

Still referring to FIG. 3, a barrier layer 48 having a thickness ranging between about 5 Å and about 65 Å is formed on titanium silicide layer 46. Preferably, barrier layer 48 is a layer of titanium nitride. Barrier layer 48 may be formed using PVD, CVD, atomic layer deposition (ALD), or the like. Barrier layer 48 provides a highly reliable interface with a subsequently deposited metal film such as, for example, tungsten, and improves electromigration resistance.

A film or layer 50 of an electrically conductive material is formed on barrier layer 48 and preferably fills openings 36 and 38, thereby forming a metal-filled barrier-lined opening. By way of example layer 50 is tungsten. Techniques for forming tungsten on a barrier layer are known to those skilled in the art.

Figure 4:
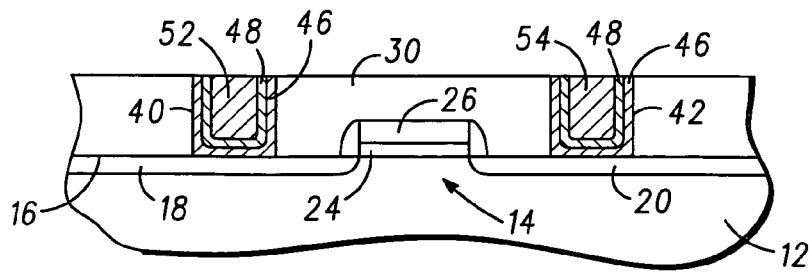
FIG. 4 is a cross-sectional side view of the semiconductor component of FIG. 3 at a later stage of manufacture.

Referring now to FIG. 4, tungsten layer 50 is polished using, for example, a Chemical Mechanical Polishing (CMP) technique having a high selectivity to dielectric layer 30. Thus, the polishing stops on dielectric layer 30. After polishing tungsten layer 50, portions 52 and 54 remain in openings 36 and 38, respectively. As those skilled in the art are aware, Chemical Mechanical Polishing is also referred to as Chemical Mechanical Planarization. The method for polishing tungsten layer 50 is not a limitation of the present invention. Other suitable polishing techniques include electropolishing, electrochemical polishing, chemical polishing, and chemical enhanced planarization. Polishing tungsten layer 50 electrically isolates portions of tungsten layer 50 from each other.

By now it should be appreciated that a semiconductor component having a titanium silicide contact structure and a method for manufacturing the semiconductor component have been provided. The titanium silicide contact structure is formed by depositing a layer of titanium over the sidewalls and a bottom of the opening. Silane is reacted with the titanium layer to form titanium silicide. Advantages of the present invention are that it simplifies the process for forming a titanium silicide layer, reduces processing costs, and offers a means of controllably forming the thickness of the titanium silicide layer.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:

providing a semiconductor substrate having a major surface;

forming a layer of dielectric material over the semiconductor substrate;

forming an opening in the layer of dielectric material, wherein the opening has sidewalls and exposes a portion of the major surface;

sputtering titanium silicide from a titanium silicide target onto the sidewalls and the exposed portion of the major surface to form a layer of titanium silicide having a thickness ranging from about 20 Å to less than 150 Å.

2. The method of claim 1, further including forming an electrically conductive material in the opening.

3. The method of claim 2, further including forming a layer of titanium nitride on the titanium silicide.

4. The method of claim 3, wherein forming the electrically conductive material in the opening further includes forming an electrically conductive material on the titanium nitride.

5. The method of claim 4, wherein the electrically conductive material is tungsten.

* * * * *